(12) United States Patent
Kell et al.

(10) Patent No.: US 11,525,066 B2
(45) Date of Patent: *Dec. 13, 2022

(54) MOLECULAR INKS

(71) Applicants: National Research Council of Canada, Ottawa (CA); Groupe Graham International Inc., Lachine (CA)

(72) Inventors: Arnold J. Kell, Ottawa (CA); Sylvie Lafrenière, Lac-Tremblant-Nord (CA); Chantal Paquet, Ottawa (CA); Patrick Malenfant, Orleans (CA); Olga Mozenson, Ottawa (CA)

(73) Assignees: National Research Council of Canada, Ottawa (CA); Groupe Graham International Inc., Lachine (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/102,661

(22) Filed: Nov. 24, 2020

(65) Prior Publication Data

US 2021/0079248 A1 Mar. 18, 2021

Related U.S. Application Data

(63) Continuation of application No. 15/319,910, filed as application No. PCT/CA2015/050568 on Jun. 19, 2015, now Pat. No. 10,883,011.

(60) Provisional application No. 62/014,360, filed on Jun. 19, 2014.

(51) Int. Cl.

| C09D 11/52 | (2014.01) |
|---|---|
| C09D 11/033 | (2014.01) |
| H05K 1/09 | (2006.01) |
| H01Q 1/38 | (2006.01) |
| H01Q 1/36 | (2006.01) |
| H01Q 1/22 | (2006.01) |
| C09D 11/38 | (2014.01) |
| C09D 11/08 | (2006.01) |
| C09D 11/14 | (2006.01) |
| H01Q 1/24 | (2006.01) |
| H05K 3/12 | (2006.01) |
| H05K 3/10 | (2006.01) |

(52) U.S. Cl.
CPC ............ *C09D 11/52* (2013.01); *C09D 11/033* (2013.01); *C09D 11/08* (2013.01); *C09D 11/14* (2013.01); *C09D 11/38* (2013.01); *H01Q 1/2225* (2013.01); *H01Q 1/24* (2013.01); *H01Q 1/364* (2013.01); *H01Q 1/38* (2013.01); *H05K 1/095* (2013.01); *H05K 3/105* (2013.01); *H05K 3/1216* (2013.01); *H05K 2201/0257* (2013.01); *H05K 2203/1131* (2013.01); *H05K 2203/1136* (2013.01)

(58) Field of Classification Search
None
See application file for complete search history.

(56) References Cited

U.S. PATENT DOCUMENTS

| 7,115,218 B2 | 10/2006 | Kydd et al. |
| 7,629,017 B2 | 12/2009 | Kodas et al. |
| 7,683,107 B2 | 3/2010 | Yang |
| 7,691,664 B2 | 4/2010 | Kodas et al. |
| 7,976,737 B2 | 7/2011 | Heo et al. |
| 9,198,288 B2 | 11/2015 | Wu et al. |
| 9,283,618 B2 | 3/2016 | Wu et al. |
| 2003/0180451 A1 | 9/2003 | Kodas et al. |
| 2007/0102685 A1 | 5/2007 | Kodas et al. |
| 2007/0122932 A1 | 5/2007 | Kodas et al. |
| 2007/0125989 A1 | 6/2007 | Kodas et al. |
| 2007/0154644 A1 | 7/2007 | Hwang et al. |
| 2008/0108218 A1 | 5/2008 | Kodas et al. |
| 2011/0039096 A1* | 2/2011 | Wu ................ C09D 11/52 428/336 |
| 2011/0111138 A1 | 5/2011 | McCullogh et al. |
| 2012/0104330 A1 | 5/2012 | Choi et al. |
| 2012/0175147 A1* | 7/2012 | Nakako ............ C23C 20/04 174/133 R |
| 2013/0121872 A1 | 5/2013 | Matsumoto |
| 2013/0156971 A1 | 6/2013 | McCullogh et al. |

(Continued)

FOREIGN PATENT DOCUMENTS

| CN | 102270514 A | 12/2011 |
| CN | 102863845 A | 1/2013 |

(Continued)

OTHER PUBLICATIONS

Office Action dated Nov. 29, 2017 on Singapore application 11201610182S.
Extended European Search Report dated Jan. 9, 2018 on European application 15810065.1.
Office Action dated Apr. 10, 2018 on U.S. Appl. No. 15/319,910.
Office Action dated Oct. 3, 2018 on Singapore application 11201610182S.

(Continued)

*Primary Examiner* — Tanisha Diggs
(74) *Attorney, Agent, or Firm* — Brunet & Co., Ltd.; Hans Koenig; Robert Brunet

(57) ABSTRACT

A flake-less molecular ink suitable for printing (e.g. screen printing) conductive traces on a substrate has 30-60 wt % of a $C_8$-$C_{12}$ silver carboxylate and 0.1-10 wt % of a polymeric binder, or 5-75 wt % of bis(2-ethyl-1-hexylamine) copper (II) formate, bis(octylamine) copper (II) formate or tris (octylamine) copper (II) formate and 0.25-10 wt % of a polymeric binder, and balance of at least one organic solvent, wherein the binder has ethyl cellulose, and the ethyl cellulose has an average weight molecular weight in a range of 60,000-95,000 g/mol and a bimodal molecular weight distribution.

13 Claims, 12 Drawing Sheets

(56) References Cited

U.S. PATENT DOCUMENTS

| | | |
|---|---|---|
| 2013/0161573 A1 | 6/2013 | Torardi et al. |
| 2013/0277096 A1 | 10/2013 | Seong et al. |
| 2014/0124713 A1 | 5/2014 | Majumdar et al. |
| 2014/0178601 A1 | 6/2014 | Wei et al. |
| 2014/0349025 A1 | 11/2014 | Hui et al. |
| 2015/0132476 A1 | 5/2015 | Wu et al. |
| 2015/0298248 A1 | 10/2015 | Walker et al. |
| 2015/0299489 A1 | 10/2015 | Walker |

FOREIGN PATENT DOCUMENTS

| | | |
|---|---|---|
| CN | 103597547 A | 2/2014 |
| JP | S61136978 A | 6/1986 |
| JP | S63278983 A | 11/1988 |
| JP | 2005537386 A | 12/2005 |
| JP | 2008013466 A | 1/2008 |
| JP | 2008031104 A | 2/2008 |
| WO | 03/032084 A2 | 4/2003 |
| WO | 2006/093398 A1 | 9/2006 |
| WO | 2010/032937 A2 | 3/2010 |
| WO | 2010/128107 A1 | 11/2010 |
| WO | 2012/014933 A1 | 2/2012 |
| WO | 2012/144610 A1 | 10/2012 |
| WO | 2013/036519 A1 | 3/2013 |
| WO | 2013/073331 A1 | 5/2013 |
| WO | 2013/073349 A1 | 5/2013 |
| WO | 2013/096664 A1 | 6/2013 |
| WO | 2015/160938 A1 | 10/2015 |
| WO | 2015/183679 A1 | 12/2015 |

OTHER PUBLICATIONS

Office Action dated Nov. 16, 2018 on European application 15810065.1.
Office Action dated Nov. 27, 2018 on U.S. Appl. No. 15/319,910.
Office Action dated Feb. 5, 2019 on Japanese application 2016-573028.
Office Action dated Mar. 12, 2019 on U.S. Appl. No. 15/319,910.
Office Action dated Jul. 17, 2019 on Indian application 201627042449.
Office Action dated Aug. 29, 2019 on Singapore application 11201610182S.
Office Action dated Sep. 12, 2019 on Chinese application 201580032170.0.
Office Action dated Dec. 27, 2019 on U.S. Appl. No. 15/319,910.
Office Action dated Mar. 9, 2020 on Chinese application 201580032170.0.
Extended European Search Report dated Apr. 29, 2020 on European application 19209067.8.
Office Action dated May 29, 2020 on Vietnamese application 1-2016-05203.
Office Action dated Mar. 9, 2020 on Chinese application 201580032170.0 with English summary.
Written Opinion and Search Report dated Sep. 22, 2015 on PCT/CA2015/050568.
Choi et al, J. Mater. Chem., 2012, 22, 3624.
Dearden et al. Macromol. Rapid Commun. 2005, 26, 315-318.
Hwang et al. Bull. Korean Chem. Soc. 2014, vol. 35, No. 1, 147.
Jahn et al. Thin Solid Films 518 (2010) 3218-3222.
Kamyshny et al. The Open Applied Physics Journal, 2011, 4, 19-36.
Kim et al. Thin Solid Films 520 (2012) 2731-2734.
Malenfant et al. NRC Printable Electronics. IDTechEx—Santa Clara 2013—Booth G12.
Paquet et al. PE-3-1-PosterCPEIA, 2015.
Deore et al. PE3-1-PosterCSC, 2015.
Shen et al. Journal of Electronic Materials, vol. 44, No. 2, 2015.
Shin et al. J. Mater. Chem., 2012, 22, 11755.
Yabuki et al. Thin Solid Films 519 (2011) 6530-6533.
Yabuki et al. Materials Research Bulletin 47 (2012) 4107-4111.
Office action dated Sep. 17, 2021 on Canadian application CA 2,950,628.
Office action dated Apr. 20, 2021 on Mexican application MX/a/2016/016659.
Office action dated Jun. 28, 2021 on Korean application 10-2017-7001726.
Office action dated Sep. 29, 2021 on Korean application 10-2017-7001726.

* cited by examiner

Electrical Properties of Conductive Traces Made From Silver-based Molecular Inks

| Example | Molecular Weight Ethyl Cellulose (g/mol) | Concentration Ethyl Cellulose (wt%) | Solvent | Sheet Resistance (mΩ/sqr) | Trace Thickness (μm) | Volume Resistivity (μΩ·cm) | Sheet Resistivity (mΩ/sqr/mil) |
|---|---|---|---|---|---|---|---|
| C1 | None | 0 | Xylene | 47.8 | 0.7 | 3.3 | 1.33 |
| E1 | ~65000 | 5 | Xylene | 56.1 | 1.32 | 7.4 | 2.92 |
| E2 | ~65000 | 2.5 | Xylene | 47.7 | 1.24 | 5.9 | 2.33 |
| E3 | ~65000 | 1.25 | Xylene | 35.4 | 1.24 | 4.4 | 1.79 |
| E4 | ~65000 | 0.25 | Xylene | 30.7 | 1.08 | 3.3 | 1.31 |
| E5 | ~96000 | 2.5 | Xylene | 61.1 | - | - | - |
| E6 | ~96000 | 1.25 | Xylene | 35.5 | - | - | - |
| E7 | ~96000 | 0.25 | Xylene | 38.9 | - | - | - |
| E8 | ~96000 | 2.5 | Toluene | 117 | 0.67 | 7.5 | 2.9 |
| E9 | ~65000 | 5 | Xylene:Terpineol (3:1) | 63.3 | 2.7 | 17.4 | - |
| E10 | ~65000 | 5 | Xylene:Terpineol (1:1) | 80.4 | 1.62 | 13.1 | - |
| E11 | ~65000~96000 (7:1) | 5 | Xylene:Terpineol (7:1) | 202 | 0.62 | 11.6 | 4.5 |

Fig. 1A

Mechanical Properties of Conductive Traces Made From Silver-based Molecular Inks

| Example | Molecular Weight Ethyl Cellulose (g/mol) | Concentration Ethyl Cellulose (wt%) | Solvent | Tensile Flex (Resistance Change, %) | Compressive Flex (Resistance Change, %) | Tensile crease (Resistance Change, %) | Compressive Crease (Resistance Change, %) |
|---|---|---|---|---|---|---|---|
| C1 | None | 0 | Xylene | less than 10% | less than 10% | less than 10% | FAIL |
|  |  |  |  | less than 10% | less than 10% | less than 10% | FAIL |
|  |  |  |  | less than 10% | less than 10% | less than 10% | FAIL |
| E1 | ~65000 | 5 | Xylene | less than 10% | less than 10% | greater than 10% | greater than 20% |
|  |  |  |  | less than 10% | less than 10% | less than 10% | less than 10% |
|  |  |  |  | less than 10% | less than 10% | greater than 10% | greater than 40% |
| E2 | ~65000 | 2.5 | Xylene | less than 10% | less than 10% | less than 10% | FAIL |
|  |  |  |  | less than 10% | less than 10% | less than 10% | FAIL |
| E3 | ~65000 | 1.25 | Xylene | less than 10% | less than 10% | FAIL | FAIL |
|  |  |  |  | less than 10% | less than 10% | FAIL | FAIL |
| E4 | ~65000 | 0.25 | Xylene | less than 10% | less than 10% | less than 10% | FAIL |
|  |  |  |  | less than 10% | less than 10% | greater than 10% | FAIL |
| E5 | ~96000 | 2.5 | Xylene | less than 10% | less than 10% | FAIL | FAIL |
|  |  |  |  | less than 10% | less than 10% | FAIL | FAIL |
|  |  |  |  | less than 10% | less than 10% | FAIL | FAIL |
| E6 | ~96000 | 1.25 | Xylene | less than 10% | FAIL | FAIL | FAIL |
|  |  |  |  | less than 10% | greater than 10% | FAIL | FAIL |
| E7 | ~96000 | 0.25 | Xylene | less than 10% | greater than 10% | FAIL | FAIL |
|  |  |  |  | less than 10% | greater than 10% | FAIL | FAIL |
|  |  |  |  | less than 10% | greater than 10% | FAIL | FAIL |
| E8 | ~96000 | 2.5 | Toluene | less than 10% | less than 10% | less than 10% | greater than 10% |
|  |  |  |  | less than 10% | less than 10% | less than 10% | greater than 100% |
|  |  |  |  | less than 10% | less than 10% | less than 10% | greater than 100% |
| E9 | ~65000 | 5 | Xylene:Terpineol (3:1) | less than 10% | less than 10% | less than 10% | FAIL |
|  |  |  |  | less than 10% | less than 10% | greater than 10% | FAIL |
|  |  |  |  | less than 10% | less than 10% | greater than 20% | FAIL |
| E10 | ~65000 | 5 | Xylene:Terpineol (1:1) | less than 10% | less than 10% | greater than 10% | greater than 50% |
|  |  |  |  | less than 10% | less than 10% | less than 10% | greater than 100% |
|  |  |  |  | less than 10% | less than 10% | greater than 40% | greater than 50% |
| E11 | ~65000/~96000 (7:1) | 5 | Xylene:Terpineol (7:1) | less than 10% | less than 10% |  |  |
|  |  |  |  | less than 10% | less than 10% |  |  |
|  |  |  |  | less than 10% | less than 10% |  |  |
|  |  |  |  |  |  | less than 10% | less than 10% |
|  |  |  |  |  |  | less than 10% | less than 10% |
|  |  |  |  |  |  | less than 10% | less than 10% |

Fig. 1B

Properties of Conductive Traces Made From Silver-based Molecular Inks

| Ink | composition | | | | | Sheet resistivity (mΩ/□/mil) | Resolution | | Thickness (μm) | Surface roughness | | | Mechanical | | Printability (# print cycles before thinning/cleaning of screen required) |
|---|---|---|---|---|---|---|---|---|---|---|---|---|---|---|---|
| | Ag salt (%) | Ethyl cellulose (%) | Solvent 1 (%) | Solvent 2 (%) | Solvent 3 (%) | | Nominal Line Width (mil) | Measured (mil) | | $R_a$ | $R_q$ | $R_z$ | Flex | Crease | |
| E11 (NRC-2) | 50 | 5 | Xylene (39.5) | Terpineol (5.5) | - | 5 | 2.0 | 3.3 (Δ~0.7) | 0.48 | 0.02 | 0.03 | 0.19 | R increase < 10% | R increase < 10% | 4-6 |
| E12 (NRC-4) | 50 | 3.6 | Tetralin (45.4) | - | - | 7 | 2.0 | 4.1 (Δ~1.0) | 0.42 | 0.02 | 0.03 | 0.22 | R increase < 10% | R increase < 10% | >20 |
| E13 (NRC-5) | 50 | 4 | Mesitylene (37) | Tetralin (8) | - | 4 | 2.0 | 3.7 (Δ~0.8) | 0.50 | 0.04 | 0.06 | 0.31 | R increase < 10% | R increase < 10% | 10-15 |
| E14 (NRC-7) | 50 | 5 | Xylene (19.75) | Terpineol (2.75) | Diethyl-benzene (22.5) | 5 | 2.4 | 3.4 (Δ~0.9) | 0.52 | 0.03 | 0.04 | 0.23 | R increase < 10% | R increase < 10% | 10-15 |
| E15 (NRC-10) | 50 | 4 | Diethyl-benzene (34.5) | 1-octanol (11.5) | - | 6 | 2.0 | 3.4 (Δ~0.7) | 0.40 | 0.04 | 0.05 | 0.24 | R increase < 10% | R increase < 10% | >20 |
| E16 (NRC-14) | 50 | 5 | alpha-terpinene (34.5) | 1-octanol (11.5) | - | 6 | 2.0 | 4.3 (Δ~1.2) | 0.40 | 0.04 | 0.05 | 0.24 | R increase < 10% | R increase < 10% | >20 |
| E17 (NRC-15) | 50 | 5 | alpha-terpinene (40) | 1-octanol (5) | - | 7 | 2.0 | 4.4 (Δ~1.3) | - | - | - | - | R increase < 10% | R increase < 10% | >10 |
| E18 (NRC-51) | 50 | 4 | 2-methylbicyclo hexane (46%) | - | - | 3 | 2.0 | 4.3 (Δ~1.2) | - | - | - | - | R increase < 10% | R increase < 10% | >20 |

Fig. 4

| Ink type | Substrate | Trace thickness (μm) | Nominal Trace width on film (mil) | Resistivity (mΩ/sq/mil) | Flex test ASTM (R increase in %) | Crease test ASTM (R increase in %) | Current carrying capacity ASTM (mA) | Silver migration ASTM |
|---|---|---|---|---|---|---|---|---|
| NRC-2 | Polyimide | 0.6-0.9 | 5 | 3.8 | 2.2 | 0.56 | 186 | PASS |
| | | | 10 | 3.7 | 1.5 | 0.69 | 259 | |
| Henkel 725A | PET | 12-16 | 5 | 17 | 0.39 | 0.36 | 161 | PASS |
| | | | 10 | 12 | 0.54 | 0.82 | 225 | |
| Henkel 725A | Polyimide | 12-16 | 5 | 23 | 0.9 | 3.21 | 598 | PASS |
| | | | 10 | 23 | 1.65 | 3.25 | 523 | |

Fig. 7

| Nominal linewidth (mil) | 2 | 3 | 5 | 10 | 15 | 20 |
|---|---|---|---|---|---|---|
| Ω | 329 | 244 | 175 | 106 | 80 | 63 |
| Length (μm) | 1.00E+05 | 1.00E+05 | 1.00E+05 | 1.00E+05 | 1.00E+05 | 1.00E+05 |
| Linewidth (mil) | 6.60 | 7.16 | 9.08 | 13.40 | 19.00 | 23.50 |
| Δ (mil) | 2.30 | 2.08 | 2.04 | 1.70 | 2.00 | 1.75 |
| Linewidth (μm) | 167.64 | 181.86 | 230.63 | 340.36 | 482.60 | 596.90 |
| # of □ | 597 | 550 | 434 | 294 | 207 | 168 |
| Ω/□ | 0.55 | 0.44 | 0.40 | 0.36 | 0.39 | 0.38 |
| mΩ/□ | 552 | 444 | 404 | 361 | 386 | 376 |
| Line thickness (μm) | 0.55 | 0.62 | 0.90 | 1.29 | 1.16 | 0.88 |
| Thickness (mil) | 2.2E-02 | 2.4E-02 | 3.5E-02 | 5.1E-02 | 4.6E-02 | 3.5E-02 |
| Sheet resistivity (mΩ/□/mil) | 11.94 | 10.83 | 14.30 | 18.32 | 17.63 | 13.03 |
| Volume resistivity (μΩ•cm) | 30.3 | 27.5 | 36.3 | 46.5 | 44.8 | 33.1 |

Fig. 8

| Nominal linewidth (mil) | 10 | 15 | 20 |
|---|---|---|---|
| Ω | 110 | 112 | 63 |
| Length (μm) | 1.00E+05 | 1.00E+05 | 1.00E+05 |
| Linewidth (mil) | 13.60 | 11.93 | 23.40 |
| Δ (mil) | 1.80 | -1.54 | 1.70 |
| Linewidth (μm) | 345.44 | 303.02 | 594.36 |
| # of □ | 289 | 330 | 168 |
| Ω/□ | 0.38 | 0.34 | 0.37 |
| mΩ/□ | 380 | 339 | 374 |
| Line thickness (μm) | 1.29 | 1.16 | 0.88 |
| Thickness (mil) | 5.1E-02 | 4.6E-02 | 3.5E-02 |
| Sheet resistivity (mΩ/□/mil) | 19.3 | 15.5 | 13.0 |
| Volume resistivity (μΩ•cm) | 49.0 | 39.4 | 33.0 |

Fig. 9

MOLECULAR INKS

CROSS-REFERENCE TO RELATED APPLICATIONS

This application is a continuation of U.S. patent application Ser. No. 15/319,910 filed Dec. 19, 2016, which is a national entry of International Application PCT/CA2015/050568 filed Jun. 19, 2015, which claims the benefit of U.S. Provisional Patent Application Ser. No. 62/014,360 filed Jun. 19, 2014, the entire contents of all of which are herein incorporated by reference.

FIELD

This application relates to molecular inks and to devices, especially flexible circuits, made therefrom.

BACKGROUND

Screen printing is a commonly used technique to produce conductive features on flexible substrates and the most common ink employed in the printed electronics industry are based on metal flakes. Industrial facilities typically have problems producing trace widths less than 100 μm and trace thicknesses less than 5 μm. Silver flake inks do not produce sufficiently conductive traces when less than 4 microns in thickness. Furthermore, silver flake inks do not lead to conductive traces that are flexible, nor can they be creased when the thickness is less than 4 microns. Silver flake inks also produce traces that suffer from adhesion limitations which require encapsulation in order to strengthen a joint with a conductive adhesive. Due to the size of the silver flakes (several microns) it is not possible to print sub-micron thick conductive traces, which is highly desired in order to minimize the aspect ratio of narrow traces. In addition, current screen printing inks cannot produce topographically flat surfaces.

As highlighted above, most commercial screen printable inks make use of silver flake formulations. The problems encountered with these flake-based inks stem from their large dimensions (several micron flake size). Because the flake is large, there can be difficulty physically printing it through small screen dimensions and producing uniform traces where all of the flakes overlap well to produce a conductive trace. In the case where screen inks are printed on polymer substrates, the inks must be sintered at lower temperatures and as a result, the flakes are only mildly sintered, generating traces with sheet resistance values typically ranging from 10-50 mOhm/sq/mil. In addition, because the resulting trace is comprised of large overlapping silver flakes, the surface topography is typically rough. Rough surfaces are particularly problematic in RFID applications where performance of the antenna is determined in part by surface roughness. There are examples of using nanoparticles (<100 nm diameters) to overcome this problem, but nanoparticles are relatively expensive to produce, and the performance gain is not sufficient enough to justify the additional cost.

There remains a need for printable molecular inks that can produce flexible conductive traces, especially molecular inks for screen printing.

SUMMARY

The molecular inks of the present invention comprise three main components: a metal precursor molecule, a binder and at least one organic solvent. Decomposition of the metal precursor molecule during ink processing produces conductive metal particles, the binder binds together the conductive metal particles and provides traces with adequate mechanical properties and adhesion to a substrate, and the solvent is mainly used to help make the ink printable, although the solvent may also dissolve the molecular ink to provide a more homogeneous ink and traces made therefrom. When deposited on a substrate to form traces and appropriately processed (e.g. by heat or light), the metal precursor molecules form conductive nanoparticles that are bound by the binder. The resulting traces are comprised of interconnected metal nanoparticles, but the nanoparticles are produced in situ, so the cost of the ink can compete with that of commercial flake based inks. In addition, due to the interconnected nanoparticle structure, the resistivity values are lower than metal flake-based inks. Further, traces derived from molecular inks show improved bonding to adhesives than metal flake-based inks, have better print resolution than metal flake-based inks and are up to 8 times less rough than metal flake-based inks.

In one aspect, there is provided a molecular ink comprising a flake-less printable composition of 30-60 wt % of a $C_8$-$C_{12}$ silver carboxylate, 0.1-10 wt % of a polymeric binder and balance of at least one organic solvent, all weights based on total weight of the composition.

In another aspect, there is provided a molecular ink comprising a flake-less printable composition of 30-60 wt % of a $C_8$-$C_{12}$ silver carboxylate, 0.25-10 wt % of a polymeric binder and balance of at least one organic solvent, all weights based on total weight of the composition.

In another aspect, there is provided a flake-less printable composition of 5-75 wt % of bis(2-ethyl-1-hexylamine) copper (II) formate, bis(octylamine) copper (II) formate or tris(octylamine) copper (II) formate, 0.1-10 wt % of a polymeric binder and balance of at least one organic solvent, all weights based on total weight of the composition.

In another aspect, there is provided a flake-less printable composition of 5-75 wt % of bis(2-ethyl-1-hexylamine) copper (II) formate, bis(octylamine) copper (II) formate or tris(octylamine) copper (II) formate, 0.25-10 wt % of a polymeric binder and balance of at least one organic solvent, all weights based on total weight of the composition.

In another aspect, there is provided a process for producing a conductive metal trace on a substrate, comprising printing the molecular ink onto a substrate to form a trace of the ink on the substrate, and sintering the trace of the ink on the printed substrate to form the conductive metal trace.

In another aspect, there is provided a printed substrate comprising a conductive trace produced by the process.

In another aspect, there is provided an electronic device comprising the conductive trace produced by the process printed on the substrate.

The molecular ink of the present invention enables an unexpected combination of properties of conductive traces that may be produced using the ink, and of devices fabricated from the conductive traces. For example, the conductive traces may have some combination being smooth, thin, narrow, flexible and highly conductive. Conductive traces may exhibit enhanced adhesion to substrates, especially flexible substrates. Enhanced adhesion permits the use of conductive epoxies without the need for encapsulation to meet an industry standard performance metric of greater than 4 lbs of shear force (no minimum value less than 4 lbs). In addition, conductive traces made from inks of the present invention may be produced more efficiently with fewer steps and therefore cost significantly less to produce than equivalent conductive traces made from pre-existing nanoparticles. Metal ions are transformed directly into a metal trace immediately usable in an electronic circuit, avoiding a step needed to form metal particles of a controlled dimension.

In particular, it is unexpected that screen printing an ink of the present invention can form a conductive trace less than 1 micron thick, which can pass standard bend and crease tests for flexibility while maintaining adhesion to a substrate and low resistance (high conductivity).

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

For clearer understanding, preferred embodiments will now be described in detail by way of example, with reference to the accompanying drawings, in which:

FIG. 1A shows data for electrical properties of conductive traces made from various silver-based molecular inks.

FIG. 1B shows data for mechanical properties (ASTM F1683-02) of conductive traces made from various silver-based molecular inks. The results in the table are change in resistance observed after the test is performed. Ideally, the resistance increase should be less than 10% following the test. Where "FAIL" is entered into the table, the trace is broken during the test and the resistance cannot be measured.

FIG. 4 shows data for electrical and mechanical properties of conductive traces made from various other embodiments of silver-based molecular inks. The nominal linewidth is the actual width of the feature in the screen used to print the traces. Δ is defined as the difference between the nominal and the measured line widths.

FIG. 7 shows data comparing the properties of molecular silver ink (NRC-2, E11) with that of a commercially available ink (Henkel 725A). Note that properties highlighted in grey do not match the performance of NRC-2.

FIG. 8 shows data for photonic sintered NRC-7 on Kapton™ at 2.4K V and a pulse width of 1500 ms. The prints were not dried prior to photonic sintering.

FIG. 9 shows data for photonic sintered NRC-16 on Melinex™ at 2.6 KV and a pulse width of 1000 ms. The prints were dried for 15 minutes prior to photonic sintering. Thicknesses of the traces could not be directly measured due to distortion of the substrate near the edges of the traces. The thicknesses are based on measurements of comparable traces printed on Kapton™.

DETAILED DESCRIPTION

Figure 1C:
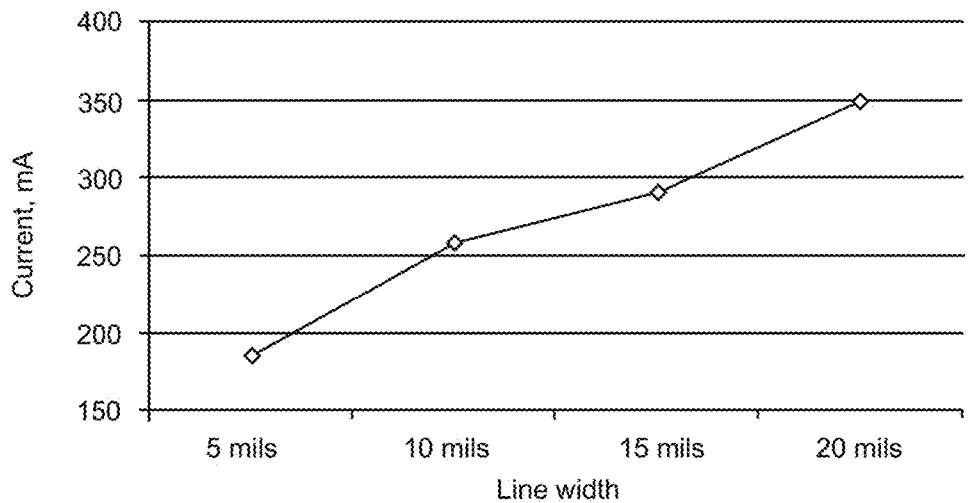
FIG. 1C is a graph showing current carrying capacity as measured by ASTM F1681-07a for 5-20 mil wide traces made from a silver-based ink of the present invention.

The molecular ink is flake-less, not making use of metallic flakes to provide conductivity. Instead, the molecular ink comprises a metal precursor molecule, specifically a metal carboxylate, more specifically a $C_8$-$C_{12}$ silver carboxylate or bis(2-ethyl-1-hexylamine) copper (II) formate, bis(octylamine) copper (II) formate or tris(octylamine) copper (II) formate. Because the ink does not contain flakes, conductive traces formed from the ink comprise interconnected metal nanoparticles, which permit the formation of very thin and narrow conductive traces.

The molecular ink comprises a composition comprising about 30-60 wt % of a $C_8$-$C_{12}$ silver carboxylate or about 5-75 wt % of bis(2-ethyl-1-hexylamine) copper (II) formate, bis(octylamine) copper (II) formate or tris(octylamine) copper (II) formate, weights based on total weight of the composition. Preferably, the composition comprises about 45-55 wt %, for example about 50 wt %, of the silver carboxylate, or about 65-75 wt %, for example about 72 wt %, of the bis(2-ethyl-1-hexylamine) copper (II) formate, bis(octylamine) copper (II) formate or tris(octylamine) copper (II) formate.

In one embodiment, the silver carboxylate is a silver salt of a $C_8$-$C_{12}$ alkanoic acid. The alkanoic acid is preferably a decanoic acid, more preferably neodecanoic acid. The silver carboxylate is most preferably silver neodecanoate. In another embodiment, the metal carboxylate is a copper complex of formic acid and 2-ethyl-1-hexylamine or octylamine. The copper carboxylate is most preferably bis(2-ethyl-1-hexylamine) copper (II) formate.

The composition in the molecular ink also comprises about 0.1-10 wt %, preferably about 0.25-10 wt % of a polymeric binder, based on total weight of the composition. For screen printable silver inks, the composition preferably comprises about 2.5-5 wt % of the binder, for example about 5 wt %. For copper inks, the composition preferably comprises about 0.5-2 wt % of the binder, more preferably about 0.5-1.5 wt %, for example about 1 wt %.

The amount of polymeric binder may also be expressed in terms of the mass of the metal in the metal precursor molecule. Preferably, the polymeric binder may be present in the composition in a range of about 2.5-52 wt % based on weight of the metal in the metal precursor. Weight of the metal in the metal precursor is the total weight of the metal without the other elements that comprise the precursor. More preferably, the polymeric binder is in a range of about 6.5-36 wt % based on weight of the metal in the metal precursor.

The polymeric binder preferably comprises ethyl cellulose, polypyrrolidone, epoxies, phenolic resins, acrylics, urethanes, silicones, styrene allyl alcohols, polyalkylene carbonates, polyvinyl acetals, polyesters, polyurethanes, polyolefins, fluoroplastics, fluoroelastomers, thermoplastic elastomers or any mixture thereof. The polymeric binder preferably comprises ethyl cellulose or polyurethane, especially ethyl cellulose.

The molecular weight of the binder, especially ethyl cellulose, may play a role in optimizing the properties of the conductive traces formed from the molecular ink. Preferably, the binder has an average weight average molecular weight ($M_w$) in a range of about 35,000-100,000 g/mol, more preferably about 60,000-95,000 g/mol. The average weight average molecular weight of the binder may be adjusted to a desired value by using a mixture of binders having different molecular weights. The mixture of binders preferably comprises a first binder having a weight average molecular weight in a range of about 60,000-70,000 g/mol, for example about 65,000 g/mol, and a second binder having a weight average molecular weight in a range of about 90,000-100,000 g/mol, for example about 96,000 g/mol. The proportion of first to second binder in the mixture is preferably about 10:1 to 1:10, or 10:1 to 1:1, or about 7:1 to 5:3. The molecular weight distribution of binder may be unimodal or multimodal, for example bimodal. In some embodiments, the binder may comprise a mixture of different types of polymers.

The composition in the molecular ink also comprises a solvent. The solvent generally makes up the balance of the composition. The balance may be, in some instances, 15-94.75 wt %. For silver inks, the balance is preferably 40-52.5 wt % solvent, for example about 45 wt %. For copper inks, the balance is preferably 25-30 wt % solvent, for example about 27 wt %.

The solvent may comprise at least one aromatic organic solvent, at least one non-aromatic organic solvent or any mixture thereof.

In some embodiments, the solvent preferably comprises at least one aromatic organic solvent. The at least one aromatic organic solvent preferably comprises benzene, toluene, ethylbenzene, xylenes, chlorobenzene, benzyl ether, anisole, benzonitrile, pyridine, diethylbenzene, propylbenzene, cumene, isobutylbenzene, p-cymene, tetralin, trimethylbenzenes (e.g. mesitylene), durene, p-cumene or any mixture thereof. The at least one aromatic organic solvent more preferably comprises toluene, xylene, anisole, diethylbenzene or any mixture thereof. For the silver-based inks, the solvent more preferably comprises xylene, diethylbenzene, toluene or any mixture thereof. For copper-based inks, the solvent preferably comprises anisole.

In some embodiments, the solvent preferably comprises at least one non-aromatic organic solvent. The at least one non-aromatic organic solvent preferably comprises a terpene-based solvent, an alcohol or any mixture thereof. Some examples of non-aromatic organic solvent include terpineol, alpha-terpinene, gamma-terpinene, terpinolene, limonene, pinene, carene, methylcyclohexanols, octanols, heptanols or any mixture thereof. Of particular note are terpineol, α-terpinene, 2-methylcyclohexanol, 1-octanol and mixtures thereof, especially 2-methylcyclohexanol. In some embodiments, the solvent preferably comprises a mixture of at least one aromatic organic solvent and at least one non-aromatic organic solvent. The non-aromatic organic solvent is preferably present in the solvent mixture in an amount of about 75 wt % or less based on the weight of the solvent, for example about 50 wt % or less. In one embodiment for silver-based inks, the solvent may comprise a mixture of xylene and terpineol or diethylbenzene and 1-octanol.

While the ink may be formulated for any kind of printing, the ink is particularly suited for screen printing. In this regard, the ink preferably has a viscosity of about 1500 cP or greater. Further, the solvent preferably has a sufficiently high boiling point so that the ink evaporates slowly during printing. This is known to increase the number of printing cycles that can be carried out before the ink must be thinned to improve performance.

The molecular ink may be deposited, for example printed, onto a substrate to form a trace of the ink on the substrate. Drying and decomposing silver salts within the trace to form conductive traces may be accomplished by any suitable technique, where the techniques and conditions are guided by the type of substrate on which the traces are deposited. For example, drying and decomposing silver salts may be accomplished by heating and/or photonic sintering.

In one technique, heating the substrate dries and sinters the trace to form a conductive trace. Sintering decomposes the metal precursor molecule to form conductive nanoparticles of the metal. Heating is preferably performed at a temperature in a range of about 125-250° C., for example about 150-230° C. For silver inks, a temperature in a range of about 200-230° C. is particularly preferred. For copper inks, a temperature in a range of about 125-175° C. is particularly preferred. Heating is preferably performed for a time of about 1 hour or less, more preferably about 15 minutes or less, for example a time in a range of about 1-15 minutes, or about 2-15 minutes, in particular about 3-10 minutes. Heating is performed at a sufficient balance between temperature and time to sinter the trace on the substrate to form a conductive trace. The type of heating apparatus also factors into the temperature and time required for sintering. Sintering may be performed with the substrate under an oxidizing atmosphere (e.g. air) or an inert atmosphere (e.g. nitrogen and/or argon gas). For silver inks, the presence of oxygen during sintering may be desired. For copper inks, an inert or a reducing atmosphere may be desired, or an oxygen depleted atmosphere having an oxygen content of preferably about 1000 ppm or less, more preferably about 500 ppm or less.

In another technique, a photonic sintering system may feature a high intensity lamp (e.g. a pulsed xenon lamp) that delivers a broadband spectrum of light. The lamp may deliver about 5-20 J/cm$^2$ in energy to the traces. Pulse widths are preferably in a range of about 0.58-1.5 ms. Driving voltages are preferably in a range of about 2.0-2.8 kV. Photonic sintering may be performed under ambient conditions (e.g. in air). Photonic sintering is especially suited for polyethylene terephthalate and polyimide substrates.

A printed substrate produced by the process may comprise a conductive trace having a thickness of about 4 microns or less. It is especially advantageous that the traces may be about 1 micron or less, for example about 0.3-1 micron or about 0.4-1 micron. The conductive trace on the substrate may be narrow having a width of about 5 mil or narrower, and can be as narrow as about 3 mil, or even as narrow as about 2 mil. Traces wider than 5 mil may be formed by adjusting printing parameters. In addition, the conductive traces are very smooth compared to flake-based inks. Surface roughness, defined by the root mean square ($R_{RMS}$) of the surface height, of conductive traces made from inks of the present invention are less than surface roughness of conductive traces made from flake-based inks. For example, surface roughness for a 0.540 µm thick trace made from an ink of the present invention is typically 0.14 µm, while for a 5 µm trace made from a flake-based ink the surface roughness is typically 0.8 µm.

Conductive traces may have a sheet resistances of about 6 mOhm/sq/mil, preferably about 5 mOhm/sq/mil or less, for example about 3-4 mOhm/sq/mil, which is lower than commercially available flake-based inks. Since the thickness of the present conductive traces may be about 1 micron or lower, the improvement in conductivity and comparable current carrying capacity is combined with a reduction in trace thickness of about 10 times. This is very significant since traces of flake-based inks are not even conductive at sub-micron thicknesses.

Traces having thicknesses of less than 4 microns produced from current flake-based inks generally perform poorly in standard bend and crease tests (ASTM F1683-02) for flexibility. In contrast, conductive traces of the present invention perform well in the ASTM standard tests for flexibility while maintaining high conductivity. In an optimal embodiment, the conductive trace can maintain resistivity (conductivity) with a change of about 15% or less, preferably about 10% or less, more preferably about 5% or less, even more preferably about 3% or less, after 10 compressive bend or 10 tensile bend cycles according to ASTM Test F1683-02. In another optimal embodiment, the conductive trace can maintain resistivity (conductivity) with a change of about 15% or less, preferably about 10% or less, more preferably about 5% or less, yet more preferably about 1% or less, after 1 compressive or 1 tensile crease cycle according to ASTM Test F1683-02.

Conductive traces produced with inks of the present invention may exhibit enhanced adhesion to substrates (especially flexible substrates) and adhesives. An adhesive may have a bond strength of 4 lbs or greater to the conductive trace without encapsulation according to IPC Shear Force Testing, which is significantly better than comparable commercially available flake-based inks.

Inks of the present invention may be deposited on a substrate by any suitable method, for example screen printing, inkjet printing, flexography printing (e.g. stamps), gravure printing, off-set printing, airbrushing, aerosol printing, typesetting, or any other method. After deposition, the ink may be dried or cured, for example by allowing the ink to dry in ambient conditions or heating the ink for an appropriately long period of time to evaporate the solvent. The inks of the present invention are particularly suited to screen printing.

Molecular inks of the prior art are generally not formulated for screen printing and result in screen-printed conductive traces having limited adhesion to substrates. Limited adhesion leads to open circuit breaks and total loss in conductivity (i.e. infinite resistivity) as the trace delaminates from the substrate surface or as the trace forms macrostructural or microstructural cracks. In contrast, conductive traces of the present invention have good adhesion to substrates as discussed above, and do not develop open circuit breaks over a period of at least 1 day, preferably at least 1 month, more preferably at least 1 year. Printed traces from the present invention get a grade of 5B (no flaking occurred) following the Cross-Hatch Adhesion Test (ASTM F1842-09).

Figure 1D:
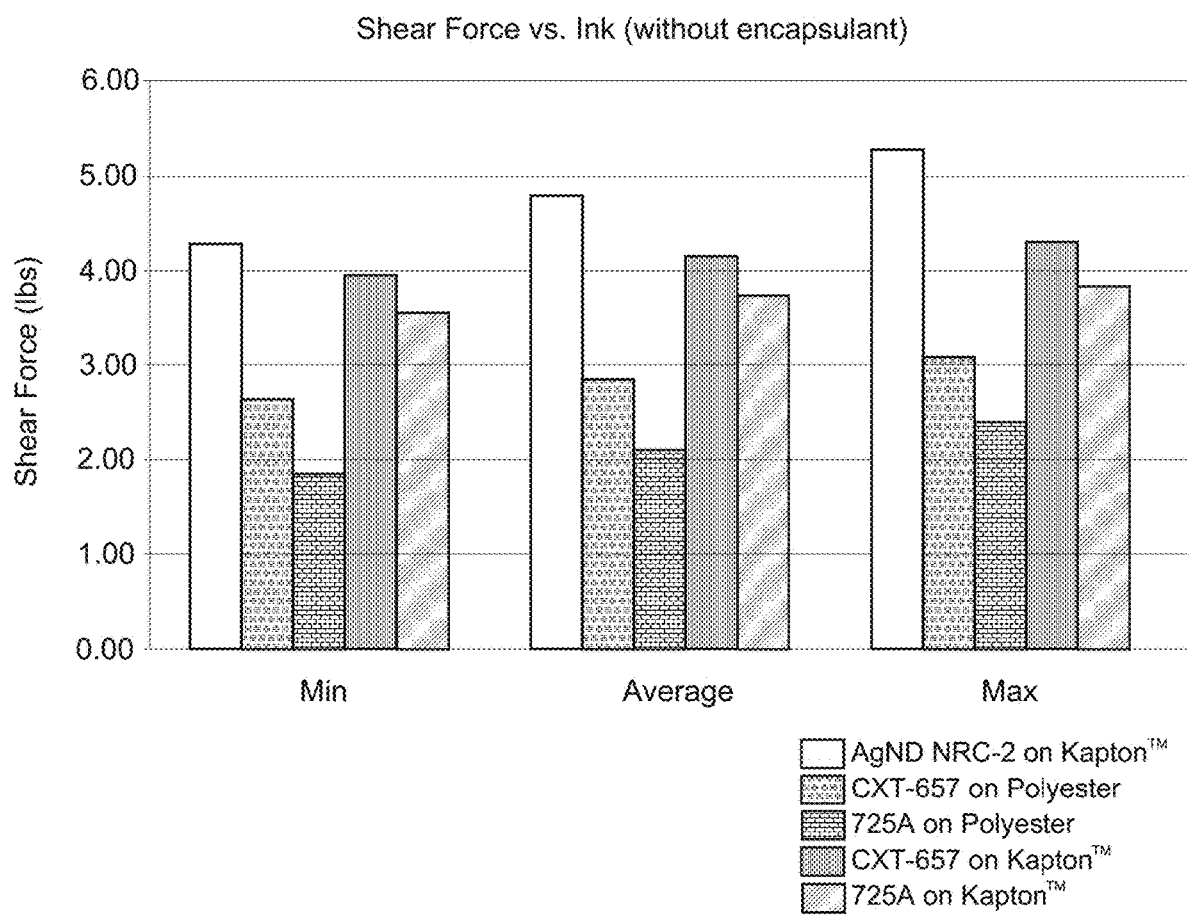
FIG. 1D is a graph comparing shear force (lbs) required to remove LEDs bound to various traces derived from silver-based inks using an adhesive without encapsulant using IPC Shear Force Test.

Conductive traces formed with the molecular ink are thinner, have lower resistivity, have better print resolution and are up to 8 times less rough than metal flake inks. In addition, the shear force required to remove light emitting diodes (LED) bonded to the traces using an epoxy adhesive is at least 1.2 times stronger than for commercially available flake-based inks (FIG. 1D).

The substrate may be any printable surface. Printable surfaces may include, for example polyethylene terephthalate (PET) (e.g. Melinex™), polyolefin (e.g. silica-filled polyolefin (Teslin™)), polydimethylsiloxane (PDMS), polystyrene, polycarbonate, polyimide (e.g. Kapton™), silicone membranes, textiles (e.g. cellulosic textiles), paper, glass, metal, dielectric coatings, among others. Flexible substrates are preferred.

The printed conductive trace on the substrate may be incorporated into an electronic device, for example electrical circuits, conductive bus bars (e.g. for photovoltaic cells), sensors, antennae (e.g. RFID antennae), touch sensors, thin film transistors, diodes, and smart packaging (e.g. smart drug packaging). The molecular ink of the present invention enables miniaturization of such electronic devices.

EXAMPLES

Example 1: Silver-Based Inks

A series of silver neodecanoate (AgND)-based inks (150 g) were formulated as described below and traces of the inks were deposited onto 8.5×11" sheets of Kapton™ HPP-ST in a variety of patterns. The patterns included dots, circles, straight traces and bent traces with features ranging in width from 2-20 mil. The patterns were produced via screen printing (Method 1) or by using a similar method in which scotch tape is used to define squares (for measuring electrical properties) or narrower and longer traces (for measuring mechanical properties) and the ink is spread using a squeegee analogous to screen printing (Method 2). Ink compositions and electrical and mechanical properties of traces produced from the ink compositions are provided in FIG. 1A, FIG. 1B and FIG. 4.

The electrical properties of the traces were characterized by measuring the resistance across the 10 cm straight traces with an ohm meter. The actual widths of the sintered traces were measured using SEM, optical microscopy, a Dektak profilometer or a Cyber Technologies 3D Surface Profiler. The trace widths can be used to determine the number of squares in each 10 cm long trace, and subsequently used to calculate the sheet resistance. This data is summarized in Table 1.

TABLE 1

| Resistivity - NRC-2 (E11) | |
|---|---|
| mΩ/□/mil | mΩ · cm |
| 5.0 ± 0.7 | 12.7 ± 1.8 |

Table 1 shows the electrical data for NRC-2 (E11) printed on Kapton™ and sintered at 230° C. for 12 minutes. It is the average for a collection of 10 cm long linear traces with 2-20 mil line widths and thicknesses ranging from 0.6-0.9 µm.

The thickness of the traces was characterized using a Dektak profilometer or a Cyber Technologies 3D Surface Profiler. Generally speaking, the 2-5 mil traces are thinner than the 10-20 mil traces and the thicknesses range from about 0.3-0.9 µm. The traces derived from the molecular ink are much thinner than those obtained using conventional silver flake inks. Using the trace thickness measurements, both the volume resistivity and the sheet resistance values for traces were calculated. Typical sheet resistance values range between 2.3-6.0 mΩ/☐/mil, depending on the trace width.

Though sheet resistance values owe their low values to the inherent thinness of the traces, the thinness does not affect the current carrying capacity, where the current carrying capacity is defined as the amperage a conductor can carry before melting/cracking either the conductor or the substrate. The traces were subjected to a standard test method for determining current carrying capacity of a conductor as part of a membrane switch circuit (ASTM F1681-07a). As highlighted in FIG. 1C, the current carrying capacity for the 5-20 mil wide traces ranges from 186 mA to 350 mA. This is comparable to traces derived from silver flake inks which have typical current carrying capacity values ranging from 150 mA to 350 mA for 5-20 mil wide traces, albeit at 4-5 µm thicknesses.

Mechanical properties of the resulting traces are also important if the ink is to find commercial utility. Mechanical testing involves subjecting a trace to the standard practice for creasing or bending a membrane switch, membrane switch tail assembly or membrane switch component (ASTM F1683-02). Bend testing involves moving a trace around a 1 cm diameter rod ten times. Crease testing involves folding a trace and rolling a 1 kg weight over the trace to generate a crease.

FIG. 4 shows data for electrical and mechanical properties of conductive traces made from various other embodiments of silver-based molecular inks. FIG. 4 contains the weight % of the silver neodecanoate (Ag salt), the weight % of ethyl cellulose binder used in the formulation and the solvent composition. Despite the variety of formulations, the sheet resistivity, trace resolution, trace thickness, surface roughness and mechanical properties of the processed traces are all consistent. Changing the ink formulation in the manner outlined in FIG. 4 serves to increase the number of print cycles that can be carried out with the ink before it has to be thinned or before the screen has to be cleaned because the print quality has decreased. As shown in FIG. 4, despite changing the formulation, the traces are still able to pass the ASTM flex and crease testing where a pass is defined as a resistance change of less than 10% after the flex or crease test is performed.

Figure 5:
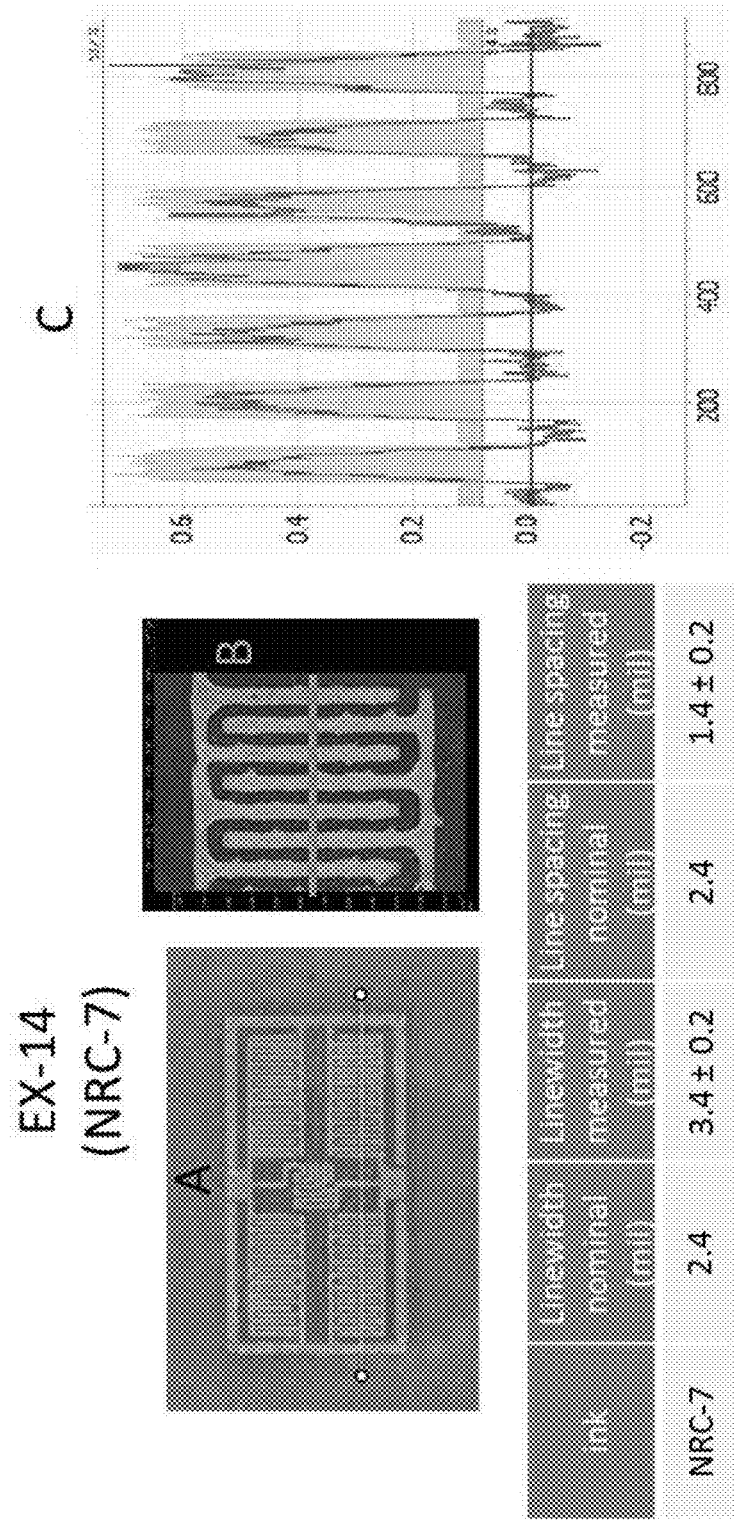
FIG. 5 illustrates line resolution of molecular ink (NRC-7) printed as an interdigitated feature with trace linewidth of 2.4 mil separated from the next feature by 2.4 mil on Kapton™ (A), the optical profilometer image of the feature (B) and the profilometer analysis of the feature showing the trace linewidth (peaks) and the space between the features (valley) (C). The grey bar graph in the background of (C) is reflectivity data. Where the reflectivity data is less intense the instrument is analyzing Kapton™ substrate, where the reflectivity intensity is high the profilometer is measuring the silver trace.
Figure 6:
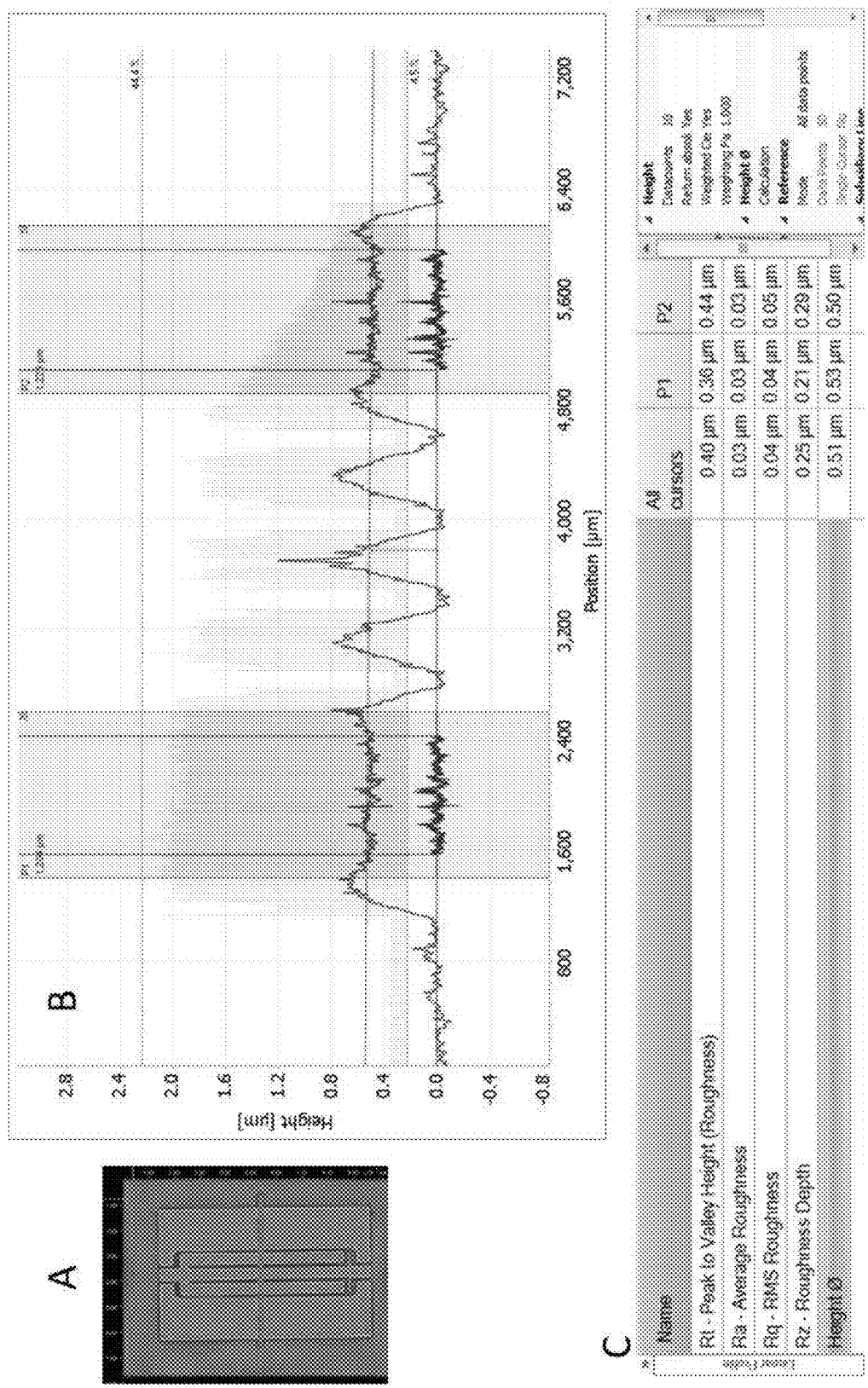
FIG. 6 depicts a digital image of a conductive trace analyzed with the profilometer (A), the corresponding data acquired from the image (B), and the resulting surface roughness analysis (C) of the trace for the two (P1 and P2) highlighted sections from (B). The conductive trace was printed with molecular ink NRC-7 (E14).
Figure 10:
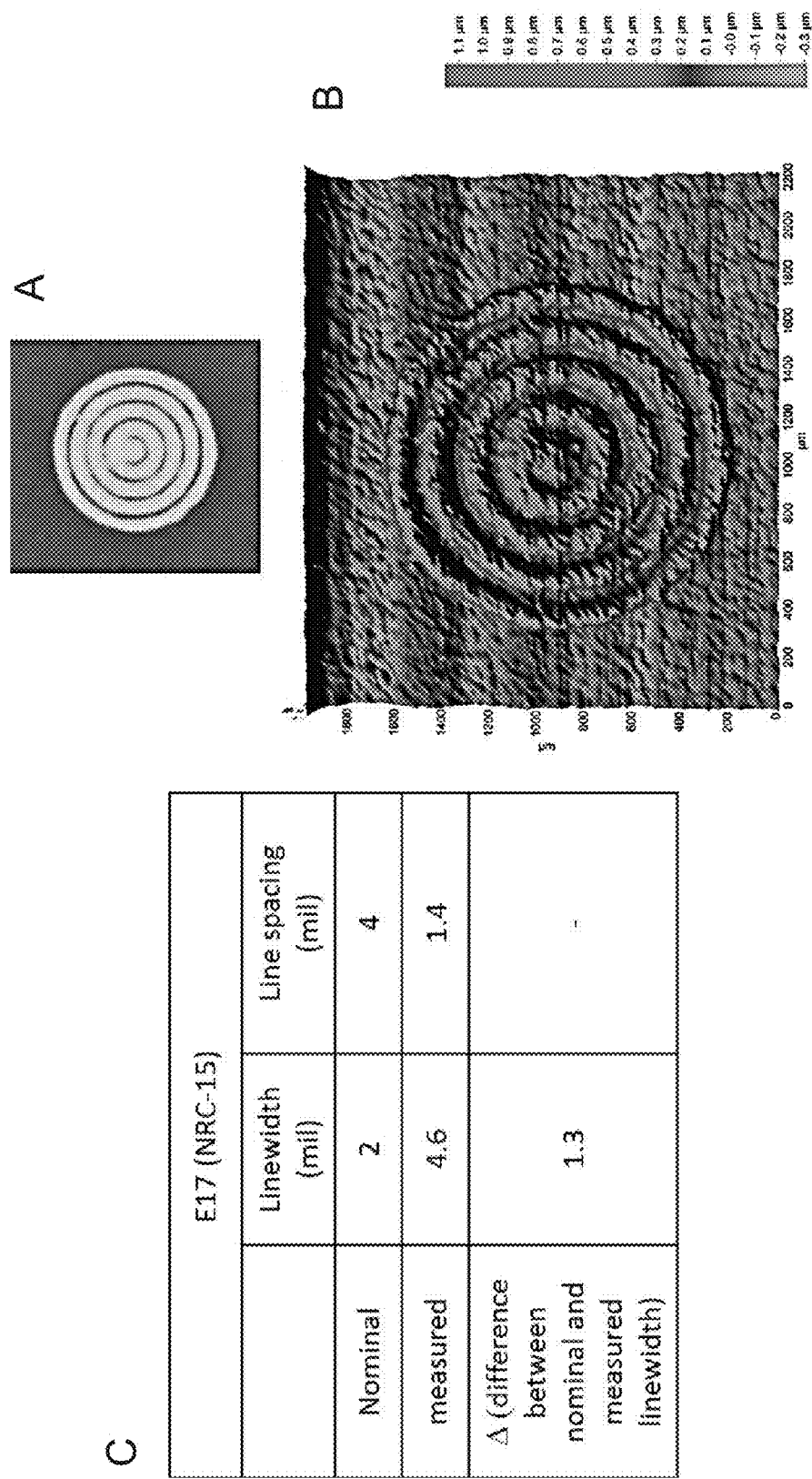
FIG. 10 illustrates line resolution of conductive traces made from silver-based molecular inks NRC-15 (E17).

In addition, the resulting traces can be printed with excellent resolution. For traces printed with NRC-7, 2.4 mil lines separated by 2.4 mils (with measured linewidth of 3.4 mil separated by 1.4 mil) were resolvable as demonstrated in FIG. 5. In addition, very smooth traces can be printed from NRC-7 with average surface roughness ($R_a$), root mean square surface roughness ($R_q$), peak to valley height ($R_t$) and mean roughness depth ($R_z$) that are about 8 times smaller than those of commercially available flake inks (FIG. 6).

Comparative Ink ($C_1$)

For comparison, a simple ink formulation including silver neodecanoate and xylene was prepared in accordance with the prior art (Dearden 2005). When this ink formulation is printed onto Kapton™ HPP-ST (from DuPont) as squares and sintered at 230° C. for 10 minutes to produce conductive traces, the sheet resistance of the silver trace is 1.33 mΩ/☐/mil, the thickness is 0.7 µm and the calculated resistivity is about 3.3 µΩ·cm. The resistivity is about 2 times that of bulk silver.

The traces initially lost less than 10% of their conductivity after the bend test as defined by ASTM F1683-02, lost more than 10% of their conductivity after the crease test. However, about 1 day after the traces conductive were created, the traces delaminated from the substrate producing an open circuit break, illustrating poor adhesion of this ink to the substrate. In addition, the viscosity of the ink is far too low for screen printing and this prior art does not teach how to formulate a screen printable ink with good adhesion and low resistivity.

Inks with Ethyl Cellulose Binder (MW=65,000 g/Mol) and Xylene Solvent (E1-E4)

Attempts to prepare screen-printable silver neodecanoate (AgND)-based ink formulations were done by adding increasing weight percentages of ethyl cellulose (EC) polymer to AgND/xylene mixtures. Specifically, 0.25%, 1.25%, 2.5% and 5% by weight solutions of EC (MW=65,000 g/mol) with 49.75%, 48.75%, 47.5% and 45% xylene and 50% AgND (by weight). As the weight percentage of EC increases, the resistivity of the sintered films increase from 3.31 µΩ·cm to 4.42 µΩ·cm to 5.86 µΩ·cm and finally to 7.42 µΩ·cm, respectively (Method 2—patterned squares). The viscosity of the ink is desirably greater than 1,500 cP for effective screen printing. This occurs as the EC weight percentage exceeds 2.5%.

With respect to mechanical properties, sintered traces produced from Method 2 based traces lose less than 10% of their conductivity after the bend test as defined by ASTM F1683-02 regardless of the EC content. At 5% EC content the traces consistently lose more than 10% of their conductivity after the crease test. However, all of the traces remain adhered to the substrate over time without producing an open circuit break, attesting to the greater adhesion of these inks to the substrate.

Inks with Ethyl Cellulose Binder (MW=96,000 g/Mol) and Xylene Solvent (E5-E8)

Attempts to prepare screen-printable inks were done with 2.5%, 1.25% and 0.5% EC (MW=96,000 g/mol), 47.5%, 48.75% and 49.5% xylene and 50% AgND. The viscosity of the ink containing 2.5% EC (MW=96,000 g/mol) was 5,000-10,000 cP and the other formulations were less than 1,500 cP. Following tape-patterned printing, the sheet resistance values of the sintered traces are 38.9 mΩ/☐, 35.5 mΩ/☐ and 61.1 mΩ/☐, respectively. This is consistent with the data acquired for similar concentrations of EC, but with a different molecular weight (MW=65,000 g/mol). The use of a higher molecular weight EC polymer does not reduce conductivity loss to below 10% in the crease test.

A toluene based ink with 2.5% EC (MW=96,000 g/mol), 47.5% toluene and 50% AgND was also evaluated. Following screen printing and sintering, traces had volume resistivity of 7.5 µΩ·cm, thickness of 0.67 µm and sheet resistance values of 2.9 mΩ/☐/mil.

Screen printed traces lose less than 10% of their conductivity after the bend test as defined by ASTM F1683-02, but consistently lose more than 10% of their conductivity after the crease test. However, the trace for E8 remained adhered to the substrate over time without producing an open circuit break, attesting to the greater adhesion of the ink to the substrate.

Ink with Ethyl Cellulose Binder (MW=65,000 g/Mol) and Xylene/Terpineol Solvent (E9-E10)

Solvent mixtures containing 1:1 and 3:1 by weight xylene:terpineol containing 5% EC (MW=65,000 g/mol) were used to formulate inks by mixing a 1:1 weight ratio of the solvent mixture with AgND. The inks comprise 50 wt % AgND, 2.5 wt % EC and 47.5 wt % solvent. The viscosity of these inks ranges from 5,000-7,500 cP. Following the preparation of patterned squares (Method 2), the resistivities of the sintered traces are 17.4 µΩ·cm and 13.1 µΩ·cm for the 3:1 and 1:1 (xylene:terpineol) based formulations, respectively. The viscosity and resistivity of the traces produced from these ink formulations are suitable for screen printing.

Screen printed traces lose less than 10% of their conductivity after the bend test as defined by ASTM F1683-02, but consistently lose more than 10% of their conductivity after the crease test. However the trace for E10 remained adhered to the substrate over time without producing an open circuit break, attesting to the greater adhesion of this ink to the substrate. The formulation containing 1:1 terpineol:xylene was also screen printed and the results are similar. There are advantages to using mixed terpineol:xylene solutions with respect to increasing the number of printing cycles achieved before thinning of the ink is required because of the presence of the high boiling terpineol.

Inks with Ethyl Cellulose Binder Mixture (MW=65,000 g/Mol and MW=96,000 g/Mol) (E11)

The use of EC with MW=39,000 g/mol, 65,000 g/mol and 96,000 g/mol alone were not optimal because the resulting processed traces consistently lost more than 10% of their conductivity after the crease test (ASTM F1683-02). The use of a 7:1 mixture of MW=65,000 and 96,000 EC (total 5% by weight) in a solvent mixture of 7:1 xylenes: terpineol provides an ink with a viscosity of 5,000-8,000 cP. The ink (AgND NRC-2) comprises 50 wt % AgND, 2.5 wt % EC and 47.5 wt % solvent. Screen printed traces have volume resistivity values of 11.6 µΩ·cm (trace thickness of 0.62 µm) and a sheet resistance of 4.5 mΩ/☐/mil).

Screen printed traces lose less than 10% of their conductivity after both the bend and crease tests as defined by ASTM F1683-02. All of the traces remain adhered to the substrate over time without producing an open circuit break. Inks where the binder is formed of a mixture of ethyl celluloses with different molecular weights provide optimized conductive traces in comparison to traces prepared from inks in which the binder is formed of an ethyl cellulose having a single molecular weight.

Adhesion strength was further examined in comparison to commercially available silver flake inks. FIG. 1D is a graph comparing the shear force (lbs) required to remove an LED bound to the trace using an adhesive (Loctite 3880). Note that this shear force test measures the bond strength between the adhesive and the trace not necessarily the trace to the substrate. The E11 ink of the present invention (AgND NRC-2) is compared to commercial screen printing conductive inks CXT-0587 (a silver-based ink from Sun Chemical Corporation of Carlstadt, N.J.) and 725A (a silver-based ink from Acheson Colloids Company of Port Huron, Mich.) on various substrates (polyester, Kapton™). It can be seen from FIG. 1D that the adhesive binds LEDs to AgND NRC-2 printed on Kapton™ with a force of at least 4 lbs, whereas the adhesion to the other traces all have at least some instances where the adhesive force is less than 4 lbs. AgND NRC-2 outperforms the other inks in all cases. The NRC-2 (E11) ink adheres to Kapton™ very well, as characterized by a grade of 5B indicating that no flaking has occurred following the ASTM F1842-09 cross-hatch adhesion test.

Further Comparisons to Flake-Based Inks

As highlighted in FIG. 7, when a molecular ink of the present invention (NRC-2) is compared to a commercially available flake-based ink (Henkel 725A), the sheet resistivity value of the ink is about 5 times smaller than that of Henkel 725A.

Photonic Sintering of NRC-7 and NRC-16

NRC-7 (E14) inks and NRC-16 (E15) inks were screen printed into the test patterns described earlier and the traces were dried for 15 minutes at 75° C. prior to photonic sintering unless otherwise indicated. All photo-processing was performed under ambient conditions using a Xenon 2000 Sinteron™. Samples were placed on a conveyor stage which transferred the substrates under the exposed area (40 mm aperture) of the Xenon lamp. The traces were processed using 1 mm conveyer steps with a pulse firing the lamp after each step. Unless otherwise indicated, wavelengths below 240 nm were filtered out of the broadband spectrum of the Xenon bulb and the bulb height was positioned such that the focal plane of light was 0.5 in above the substrate and the pulse width varied from 580 ms to 1500 ms. Each sample was irradiated with 40 pulses of light in a 6 min process cycle. As highlighted in FIG. 8, the volume resistivity and sheet resistivity values for these traces are very close to the values achieved through the thermal processing of the traces on Kapton™ substrate (about 10-20 vs. 5-7 mΩ/☐/mil, respectively). FIG. 9 also demonstrates that the molecular ink can be processed on Melinex™ and the volume resistivity and sheet resistivity values on this substrate are also only about 2-4 times higher than that for the thermally processed traces on Kapton™ (FIG. 4).

Inks with Non-Aromatic Solvents

Silver molecular inks, NRC-14 (E16), NRC-15 (E17) and NRC-51 (E18), were formulated with 50 wt % silver neodecanoate and 5% EC46 ethyl cellulose binder (NRC-14 and NRC-15) or 4% ethyl cellulose (NRC-51) in non-aromatic solvents. The solvent for NRC-14 was a mixture of 40% α-terpinene and 5% 1-octanol. The solvent for NRC-15 was a mixture of 22.5% α-terpinene and 22.5% 1-octanol. The solvent for NRC-51 was 2-methylcyclohexanol. Conductive traces of the inks were produced by screen printing test patterns of the inks on a Kapton™ substrate, annealing at 150° C. for 30 minutes, and then further processing at 230° C. for 12 minutes. The resulting line widths and trace thicknesses were measured with an optical profilometer and the sheet resistance was determined by measuring the resistance across the 10 cm long trace relative to the number of squares in the trace (FIG. 8 and FIG. 9).

Electrical properties of conductive silver traces produced from NRC-14 (E16), NRC-15 (E17) and NRC-51 (E18) are shown in FIG. 4. NRC-14 (E16) and NRC-51 (E18) can cycle through at least 20 prints without intervention and produce traces with sheet resistivity values less than 10 mΩ/☐/mil. Traces from NRC-15 can cycle through at least 10 prints without intervention and can also produce traces with sheet resistivity values of less than 10 mΩ/☐/mil. Flex and crease testing data for conductive silver traces produced from NRC-14, NRC-15 and NRC-51 are shown in FIG. 4. Flex and crease testing were performed as previously described. All three inks have excellent mechanical properties. There were some cases where resistance increases greater than 10%, but there are no open fails due to cracking and/or delamination. Line resolution of conductive silver traces made from silver-based molecular ink NRC-15 is illustrated in FIG. 10. Lines were printed with a nominal 2 mil linewidth and 4 mil spacing.

Example 2: Copper-Based Inks

Bis(octylamine) copper (II) formate was prepared by suspending 5 g of copper formate dihydrate in 600 mL of acetonitrile and adding 13 mL of octylamine. The solution was mixed for 5 hours, filtered to remove unreacted copper formate and subsequently crystallized at −4° C. for 48 hrs. The crystals were collected by filtration and dried under vacuum for 5 hrs.

Tris(octylamine) copper (II) formate was prepared in a similar fashion to bis(octylamine) copper (II) formate with the exception that 18 mL of octylamine was added for every 5 g of copper (II) formate.

Bis(2-ethyl-1-hexylamine) copper (II) formate was prepared by suspending 5 g of copper formate dihydrate in 600 mL of heptane and adding 13 mL of 2-ethyl-1-hexylamine. The solution was mixed for 5 hours, filtered to remove unreacted copper formate and subsequently crystallized at −4° C. for 48 hrs. The crystals were collected by filtration and dried under vacuum for 5 hrs.

Solutions of ethyl cellulose of various molecular weights were prepared by dissolving 10% (g/g) ethyl cellulose in anisole. The weight average molecular weight ($M_w$) of the ethyl cellulose varied from about 38,000 g/mol to about 96,000 g/mol. Inks having the same wt % of ethyl cellulose were prepared by mixing 0.15 g of the 10% ethyl cellulose solutions with 1.08 g of tris(octylamine) copper (II) formate. The copper ink comprised 72 wt % copper formate complex, 1.0 wt % ethyl cellulose and 27 wt % anisole. The mixture was homogenized by planetary mixing for 8 minutes. The inks were printed on Melinex™ substrates (PET) as traces with dimensions of 7 cm×1 mm or as 1 cm×1 cm squares (Method 2). The inks were thermally sintered under nitrogen by heating to 150° C. and holding at this temperature for 3 minutes.

Figure 2A:
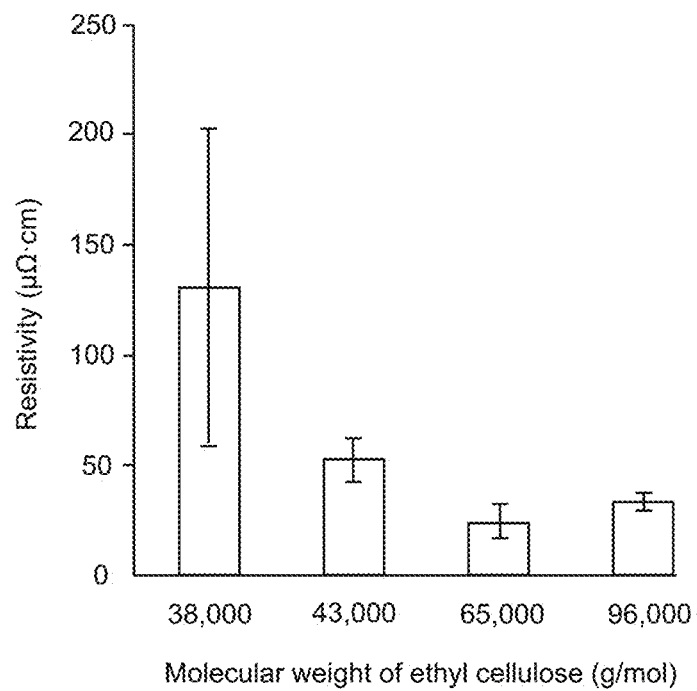
FIG. 2A is a graph of resistivity (μΩ·cm) vs. molecular weight (g/mol) of ethyl cellulose for copper films made from copper-based inks formulated with different molecular weight ethyl cellulose.
Figure 2B:
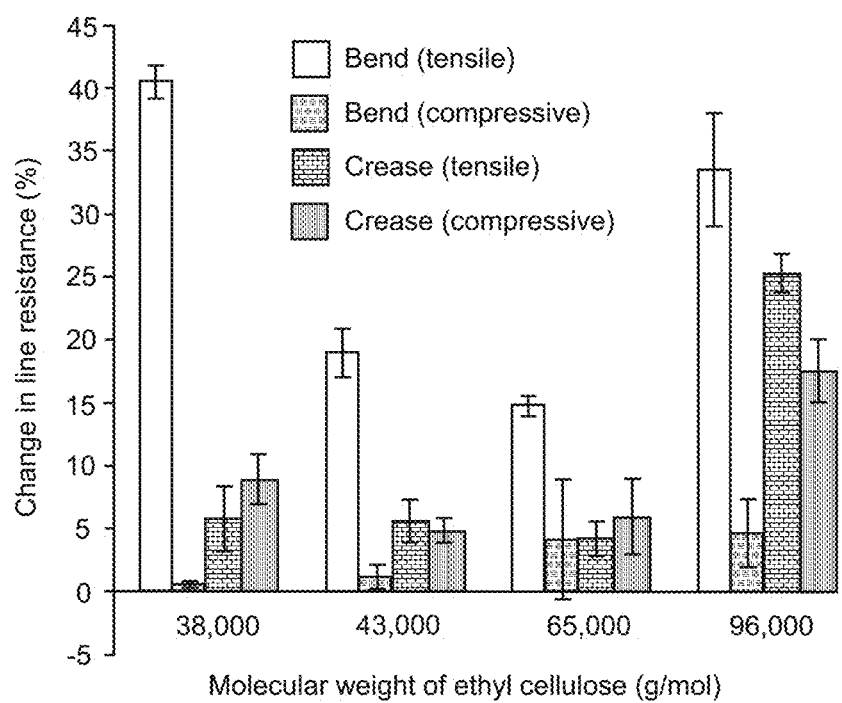
FIG. 2B is a graph of change in line resistance (%) vs. molecular weight (g/mol) of ethyl cellulose for copper traces before and after flexibility testing (ASTM F1683-02) made from copper-based inks formulated with different molecular weight ethyl cellulose.

Resistivity values of the copper films were determined on the 1 cm×1 cm squares while ASTM flexibility tests (ASTM F1683-02) were performed on the 7 cm long traces. FIG. 2A shows that resistivity values initially decrease dramatically with increasing molecular weight of the ethyl cellulose, and then begin to increase at much higher molecular weights. FIG. 2B shows a similar pattern with the change in resistance under flexibility testing. The data indicate that an optimal average molecular ($M_w$) range is about 70,000-90,000 g/mol.

Figure 3:
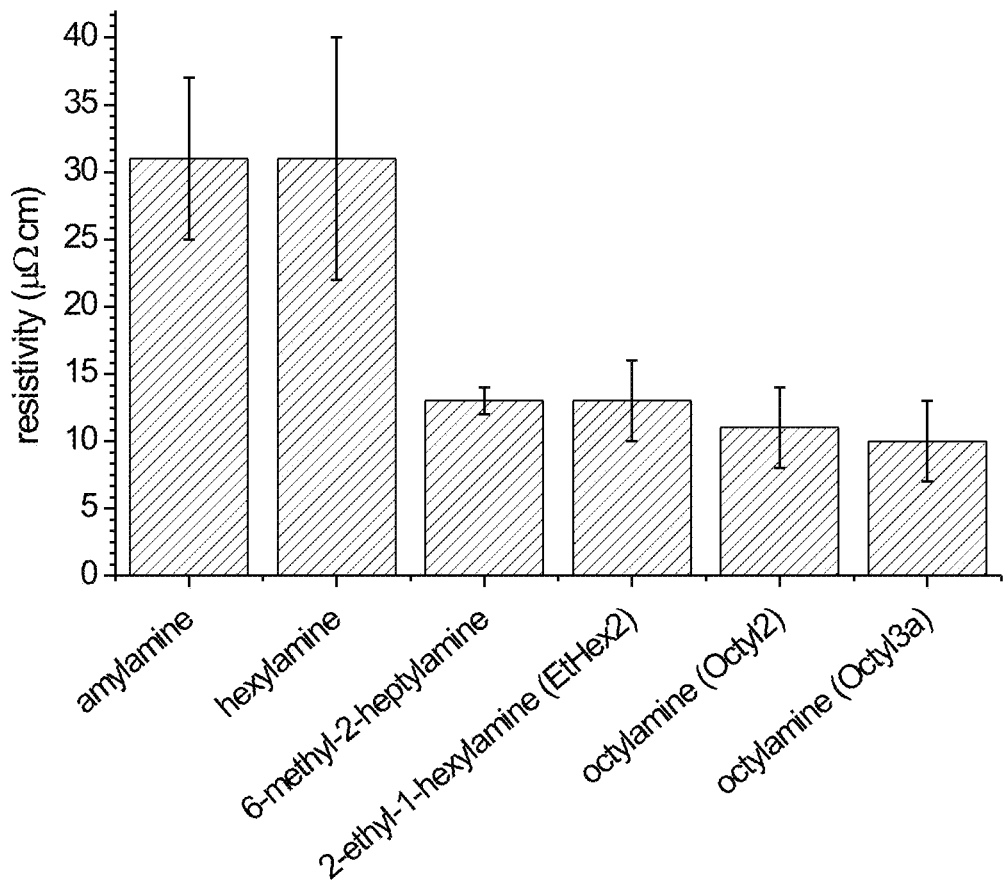
FIG. 3 is a graph showing resistivity (μΩ·cm) for traces made from a number of amine copper (II) formate-based binderless inks where amylamine is bis(amylamine) copper (II) formate, hexylamine is bis(hexylamine) copper (II) formate, 6-methyl-2-heptylamine is bis(6-methyl-2-heptylamine) copper (II) formate, EtHex2 is bis(2-ethyl-1-hexylamine), Octyl2 is bis(octylamine) copper (II) formate and Octyl3a is tris(octylamine) copper (II) formate.

In another experiment, the resistivity of traces made from a number of different amine copper (II) formate-based inks was compared. The inks were formulated without binder in anisole and traces were printed using Method 2. FIG. 3 shows that traces made from bis(2-ethyl-1-hexylamine) copper (II) formate, bis(octylamine) copper (II) formate and tris(octylamine) copper (II) formate have significantly and considerably less resistivity than traces from other amine copper (II) formate complexes, even very closely related complexes. Traces made from bis(2-ethyl-1-hexylamine) copper (II) formate (EtHex2) in particular has a resistivity 4-5 times lower than bis(hexylamine) copper (II) formate (EtHex2), and also a resistivity 2-3 times lower than the traces made from the octylamine complexes (Octyl2 and Octyl3a).

REFERENCES

The contents of the entirety of each of which are incorporated by this reference.

Choi Y-H, Lee J, Kim S J, Yeon D-H, Byun Y. (2012) *Journal of Materials Chemistry.* 22, 3624-3631.
Dearden A L, Smith P J, Shin D Y, Reis N, Derby B, O'Brien P. (2005) *Macromol. Rapid Commun.* 26, 315-318.
Jahn S F, Jakob A, Blaudeck T, Schmidt P, Lang H, Baumann R R. (2010) *Thin Solid Films.* 518, 3218-3222.
Kim S J, Lee J, Choi Y-H, Yeon D-H, Byun Y. (2012) *Thin Solid Films.* 520, 2731-2734.
Shin D Y, Jung M, Chun S. (2012) *Journal of Materials Chemistry.* 22, 11755-11764.
Yabuki A, Arriffin N, Yanase M. (2011) *Thin Solid Films.* 519, 6530-6533.
Yakubi A, Tanaka S. (2012) *Materials Research Bulletin.* 47, 4107-4111.
U.S. Pat. No. 7,115,218—Kydd et al. Issued Oct. 3, 2006.
U.S. Pat. No. 7,629,017—Kodas et al. Issued Dec. 8, 2009.
U.S. Pat. No. 7,683,107—Yang. Issued March 223, 2010.
U.S. Pat. No. 7,691,664—Kodas et al. Issued Apr. 6, 2010.
U.S. Pat. No. 7,976,737—Heo et al. Issued Jul. 12, 2011.
US 2011/111138—McCullough et al. Published May 12, 2011.
US 2012/0104330—Choi et al. Published May 3, 2012.
US 2013/0156971—McCullough et al. Published Jun. 20, 2013.
US 2013/0121872—Matsumoto. Published May 16, 2013.
WO 2010/032937—Nam et al. Published Mar. 25, 2010.
WO 2012/144610—Marina et al. Published Oct. 26, 2012.
WO 2012/014933—Matsumoto. Published Feb. 2, 2012.

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A molecular ink comprising a flake-less printable composition of:
   5-75 wt % of bis(2-ethyl-1-hexylamine) copper (II) formate;
   0.25-10 wt % of a polymeric binder; and,
   balance of at least one organic solvent,
   all weights based on total weight of the composition,
   wherein the binder comprises ethyl cellulose, and the ethyl cellulose has a weight average weight molecular weight in a range of 60,000-95,000 g/mol and a bimodal molecular weight distribution.

2. The ink according to claim 1, wherein the bis(2-ethyl-1-hexylamine) copper (II) formate is present in an amount of 65-75 wt % and the composition comprises 0.5-2 wt % of the binder.

3. The ink according to claim 1, wherein the composition comprises 2.5-5 wt % of the binder.

4. The ink according to claim 1, wherein the binder further comprises one or more other polymers different from ethyl cellulose.

5. The ink according to claim 1, wherein heating the ink to 125-250° C. on a substrate, under and inert or reducing atmosphere, results in the production of interconnected copper nanoparticles bound by the binder.

6. The ink according to claim 1, wherein the ethyl cellulose comprises a mixture of ethyl celluloses, the mixture comprising a first ethyl cellulose having a weight average molecular weight in a range of from 60,000-70,000 g/mol and a second ethyl cellulose having a weight average molecular weight in a range of from 90,000-100,000 g/mol.

7. The ink according to claim 1, wherein the solvent comprises an aromatic organic solvent.

8. The ink according to claim 7, wherein the aromatic organic solvent comprises toluene, xylene, anisole, diethylbenzene or any mixture thereof.

9. The ink according to claim 7, wherein the aromatic organic solvent comprises anisole.

10. A printed substrate comprising a conductive trace produced by a process comprising printing the ink as defined in claim 1 onto a substrate to form a trace of the ink on the substrate, and sintering the trace of the ink on the printed substrate to form the conductive metal trace.

11. The substrate according to claim 10, wherein the printing is screen printing.

12. The substrate according to claim 11 which is flexible.

13. The substrate according to claim 12, wherein:
- the conductive trace has a sheet resistance of 5 mOhm/sq/mil or less;
- the conductive trace does not develop an open circuit break over a period of at least 1 day;
- the conductive trace can maintain said resistance with a change of 10% or less after 10 compressive bend or 10 tensile bend cycles according to ASTM Test F1683-02;
- the conductive trace can maintain said resistance with a change of 10% or less after 1 compressive or 1 tensile crease cycle according to ASTM Test F1683-02; or,
- an adhesive has a bond strength to the conductive trace of 4 lbs or greater without encapsulation according to IPC Shear Force Testing.

\* \* \* \* \*